(12) United States Patent
Gristede et al.

(10) Patent No.: US 6,219,822 B1
(45) Date of Patent: Apr. 17, 2001

(54) METHOD AND SYSTEM FOR TUNING OF COMPONENTS FOR INTEGRATED CIRCUITS

(75) Inventors: George D. Gristede, Katonah; Wei Hwang, Armonk; Christophe Robert Tretz, Riverdale, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/129,717

(22) Filed: Aug. 5, 1998

(51) Int. Cl.[7] .................................................. H03K 19/00

(52) U.S. Cl. ............................................. 716/10; 326/113

(58) Field of Search ............................................... 326/113

(56) References Cited

U.S. PATENT DOCUMENTS 5,528,177 * 6/1996 Sridhar .................................. 326/113

* cited by examiner

Primary Examiner—Matthew Smith
Assistant Examiner—Thuan Do
(74) Attorney, Agent, or Firm—F. Chau & Associates, LLP

(57) ABSTRACT

A method for automatically tuning object sizes in an integrated circuit includes the steps of providing a circuit having objects disposed therein, inputting equations associated with the objects to provide a relationship between a size of the object and timing information of signals transmitted between the objects, extracting transition times of the signals transmitted between objects by simulating the circuit in operation by evaluating the equations and adjusting the sizes of the objects in the circuit according to the timing information and the transition times until user defined criteria are achieved for the circuit. Systems are also provided to carry out the method.

32 Claims, 8 Drawing Sheets

METHOD AND SYSTEM FOR TUNING OF COMPONENTS FOR INTEGRATED CIRCUITS

BACKGROUND OF THE INVENTION

1. Field of the Invention

The present invention relates to circuit design tools and, more particularly, to a system and method for tuning components for integrated circuits.

2. Description of the Related Art

The design of integrated circuits, for example very large scale integration (VLSI) circuits may be very time consuming and labor intensive. Many iterations are performed before a chip design is completed. The iterations required of chip designers often includes the following procedure:

1. Choose the logic and topology of the circuit to be designed.
2. Choose the initial sizes of the transistors and/or components to attempt to obtain the desired target performance of the circuit to be designed. This selection process typically involves an extensive visual inspection of the circuit and many hand calculations by the designer.
3. Run timing verification using computer aided design tools on the circuit to verify that the circuit has met its target performance.
4. If the desired target performance is not met, adjust the component, for example a transistor, sizes based on the timing results and repeat step 3. The adjustment of the component sizes in this step also includes an extensive visual inspection of the circuit and many calculations that are often performed by hand.
5. If it is not possible to meet the desired target performance using steps 3–4, alter the circuit topology and repeat steps 2–4. In addition, the designer needs to be able to obtain early estimates of circuit performance such that decisions can be made as early as possible as to whether a change in the circuit topology is essential to improve performance.

Steps 2 through 4 may be referred to as tuning steps for "tuning" the circuit. The conventional method as described above tends to be very time consuming and labor intensive. The conventional method usually relies on calculating an RC network in order to evaluate the circuit since this technique lends itself more readily to hand calculations. Therefore, a need exists for an improved system and method for tuning an integrated circuit which provides early estimates of maximum performance and rapid selection of component sizes that meets or exceeds desired performance. A further need exists for providing a more user friendly design tool for tuning integrated circuit designs.

SUMMARY OF THE INVENTION

A method for automatically tuning object sizes in an integrated circuit includes the steps of providing a circuit having objects disposed therein, inputting equations associated with the objects to provide tuning adjustment for sizes of the objects, assigning boolean expressions to represent timing or logical constraints on selected objects, evaluating the equations and the expressions to simulate the circuit in operation and adjusting the objects in the circuit until user defined criteria are achieved for the circuit.

In other methods of the present invention, the step of evaluating the equations and the expressions to simulate the circuit may include the step of measuring spacing between transitions on signals transmitted within the circuit to provide adjustments to the sizes of the objects in the circuit according to the spacings. The step of evaluating may include the step of evaluating slew according to the expressions. The step of evaluating may include the step of evaluating signal delay or any combination of evaluating slews and delays between objects according to the equations. The step of assigning Boolean expressions may include the step of representing the Boolean expressions by a simulated pulse, the simulated pulse compensating for signal spreading. The circuit may include both analog and digital objects. The objects may include transistors and parameterized subcircuits (p-cells). The step of automatically updating a schematic diagram for the circuit according to the adjusted sizes of the objects may also be included.

Another method for automatically tuning object sizes in an integrated circuit includes the steps of providing a circuit having objects disposed therein, inputting equations associated with the objects to provide a relationship between a size of the object and timing information of signals transmitted between the objects, extracting transition times of the signals transmitted between objects by simulating the circuit in operation by evaluating the equations and adjusting the sizes of the objects in the circuit according to the timing information and the transition times until user defined criteria are achieved for the circuit.

In alternate methods of the present invention, the step of inputting equations may include the step of measuring spacing between transitions on the signals transmitted within the circuit to provide adjustments to the sizes of the objects in the circuit according to the spacings. The step of evaluating may include the step of evaluating slew according to the expressions. The step of inputting equations may include the step of evaluating signal delay between objects according to the equations. The step of extracting transition times may include the step of providing a simulated pulse between objects to represent Boolean expressions, the simulated pulse compensating for signal spreading. The circuit may include both analog and digital objects. The objects may include transistors and parameterized subcircuits. The step of automatically updating a schematic diagram for the circuit according to the adjusted sizes of the objects is preferably included.

A system for automatically tuning sizes of objects in an integrated circuit includes means for inputting equations associated with the objects to provide tuning adjustment for sizes of the objects. Means for assigning boolean expressions to represent timing constraints on selected objects is included. Computing means for evaluating the equations and the expressions to simulate the circuit in operation until user defined criteria are achieved for the circuit is also included.

In alternate embodiments, the timing constraints may include spacings between transitions on signals transmitted within the circuit, the spacings being utilized to provide adjustments to the sizes of the objects in the circuit. The timing constraints may include spacing differences between pulse widths of transmitted signals between the objects. The timing constraints may include spacing differences between predetermined transition points on transmitted signals between the objects. The timing constraints may include delay and slew between the objects. The circuit may include both analog and digital objects. The objects may include transistors and parameterized subcircuits.

Another system for automatically tuning sizes of objects in an integrated circuit includes means for inputting equations, the equations being associated with the objects to provide a relationship between a size of the object and timing information of signals transmitted between the objects. Also, means for extracting transition times of the signals transmitted between objects by simulating the circuit in operation by evaluating the equations is included. Means for adjusting the sizes of the objects in the circuit according to the timing information and the transition times until user defined criteria are achieved for the circuit is also included.

In alternate embodiments, the transition times may include spacings between transitions on signals transmitted within the circuit, the spacings being utilized to provide adjustments to the sizes of the objects in the circuit. The transition times may include spacing differences between pulse widths of transmitted signals between the objects. The transition times may include spacing differences between predetermined transition points on transmitted signals between the objects. The timing information may include delay and slew between the objects. The circuit may includes analog and digital objects. The objects may include transistors and parameterized subcircuits.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention relates to circuit design tools and, more particularly, to a system and method for tuning components for integrated circuits by measuring spacing between transitions on signals for better delay and slew, by measuring an absolute transition point (for example, 50%) on signals for better delay/slew, and/or by directly evaluating slew.

The system of the present invention includes a circuit tuning program preferably written in SKILL™ (a trademark of Cadence, Inc.) and runs in the Cadence Design System, available from Cadence, Inc., using ASX™ (ASX is a trademark of IBM, Inc.). The present invention may be programmed in other programming languages as well. The system includes a graphical user interface that allows for rapid, interactive circuit tuning. The system works by automating calculations that designers conventionally do by hand from analysis of ASX simulation data (using pencil, paper and a calculator) to obtain the sizes of transistors in a circuit. The system utilizes spreadsheet type programming, allowing users to attach both simple and complicated formulas to objects, such as, transistors and parameterized subcircuits, indicating how these objects are to be sized as functions of circuit simulation results.

The system is similar in its operation to a system described in commonly assigned application Ser. No. 09/046,826 incorporated herein by reference. However, the system of the present invention uses ASX simulation data instead of static sizing formulas. The system of the present invention is meant for designers of high-performance dynamic logic (SRCMOS, domino CMOS, NORA etc.) and any other designers who require ASX-based tuning to clearly-defined timing targets.

Figure 1:
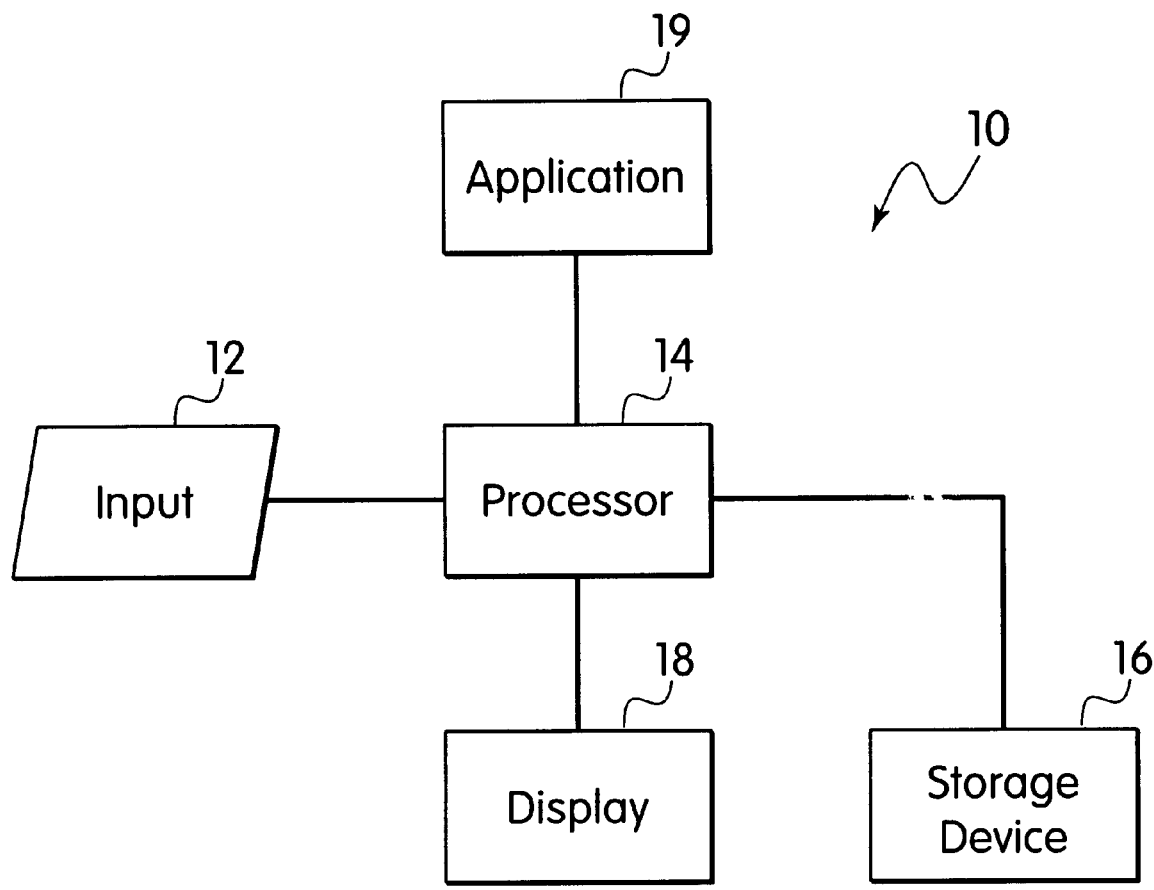
FIG. 1 is a block diagram of a system in accordance with the present invention.

It should be understood that the system shown in the figures may be implemented in various forms of hardware, software or combinations thereof. Preferably, these elements are implemented in software on one or more appropriately programmed general purpose digital computers having a processor and memory and input/output interfaces. Referring now to FIG. 1, a block diagram of a system 10 (the system) for tuning circuits is shown. System 10 includes a user input device 12, preferably a keyboard and/or a mouse, for entering or selecting circuit information to be processed by a processor 14. Processor 14 stores the user input information into a storage device 16. A display 18 is associated with the processor 14 for displaying prompts, forms, entered data, program messages output, etc. for the user. Processor 14 preferably implements the method of the present invention and employs memory space in memory storage device 16 for implementing algorithms programmed in software. A circuit topology is input into processor 14 by either defining nodes and objects representing physical devices. Alternately, a schematic diagram may be entered directly into processor 14 wherein objects are defined by a set of predetermined graphic symbols. The method of the present invention provides the ability of attaching formulas to the objects for example, to transistors and parameterized subcircuits (P-cells) indicating how these objects are tuned as functions of delays or other circuit parameters, such as slew. Processor 14 employs mathematical expressions appropriately programmed as formulas to tune and retune circuit objects. "Objects" as described herein includes electrical circuit components and devices, parameterized cells, instances of the objects, etc. Instances are described in several places in the disclosure and represent an object under varying conditions. The use of the terms objects and instances may be used interchangeably to describe the present invention.

In a preferred embodiment, system 10 includes a software application program 19 for selecting transistor sizes, etc. in accordance with the present invention. The software application is executed by processor 14 when the user executes a load command. The software program may be written in any computer language, however, it is preferable to be written in SKILL and run in a Cadence Design System available commercially from Cadence, Inc. For ease of use, the software application may provide a menu driven interface displayed on the display 18.

Figure 2:
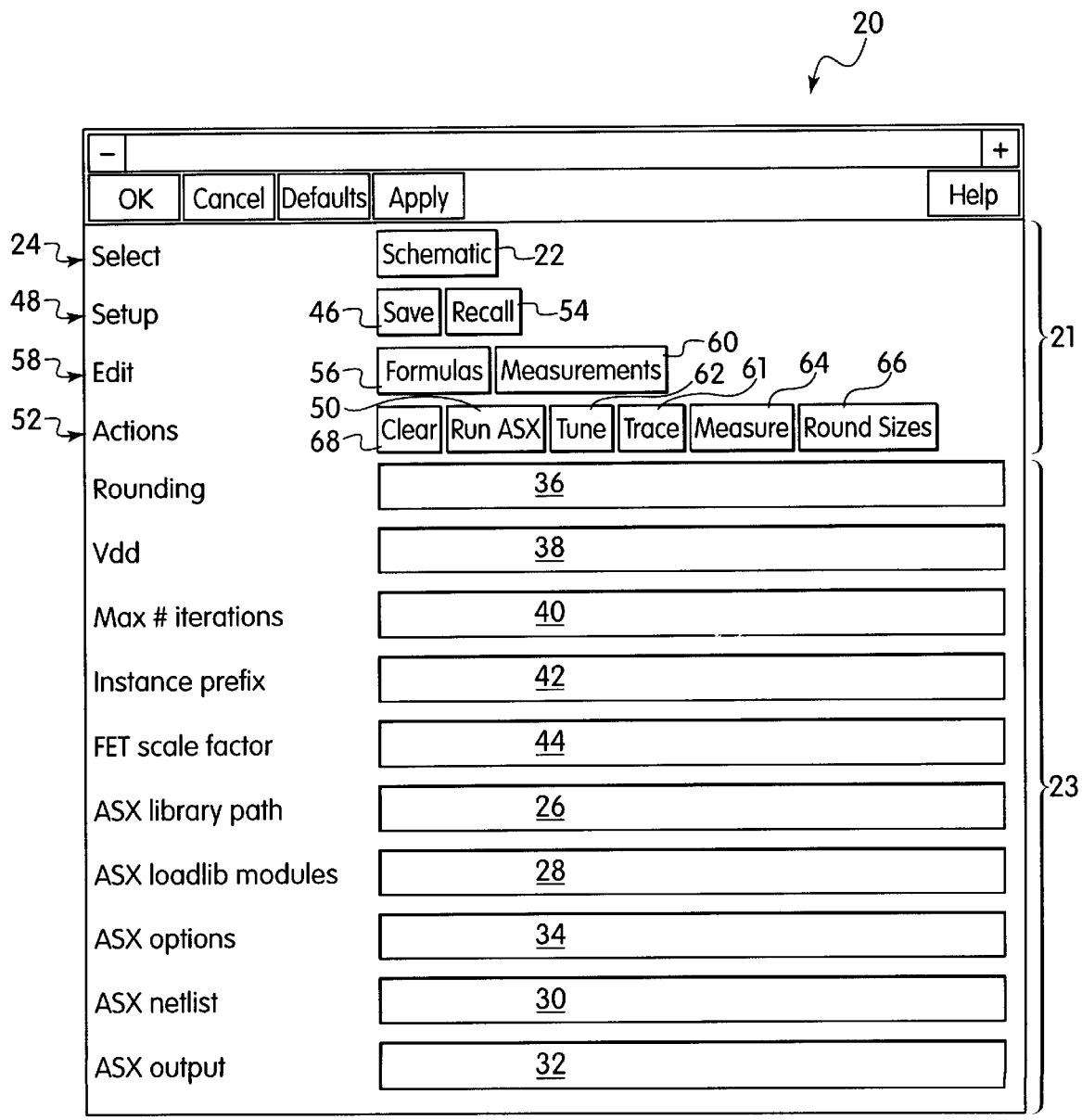
FIG. 2 is a form for recording inputs and receiving outputs in accordance with the present invention.

Referring to FIG. 2, a form 20 is shown. Form 20 is used to guide the user through the tuning method in accordance with the present invention. In a preferred embodiment, form 20 has icons 21 or virtual buttons displayed on display 18 (FIG. 1). A cursor is directed by the user using input device 12 (FIG. 1), and various functions are performed by activating icons 21 or clicking in a text field 23 and entering alphanumeric data as needed. Functions of the invention are described hereinafter in terms of form 20. "Clicking" is referred to as moving a mouse or arrow key driven cursor onto an area of form 20 and depressing a mouse button to activate that function or enter data in that area.

A working schematic is selected for tuning by clicking on schematic 22 in a select button row 24. A menu, window or listing of preloaded schematic diagrams are made available for selection. Schematic diagrams may be designed and drawn using the Cadence Design System and stored in storage device 16 for use with system 10. The schematic diagram is selected and brought up on display 18 (FIG. 1).

ASX Simulation Data Measurements

The system includes a powerful library of functions that operate on ASX simulation waveform data to allow a designer to measure any quantity desired from the simulation results. These library functions may be categorized into two groups.

Figure 3:
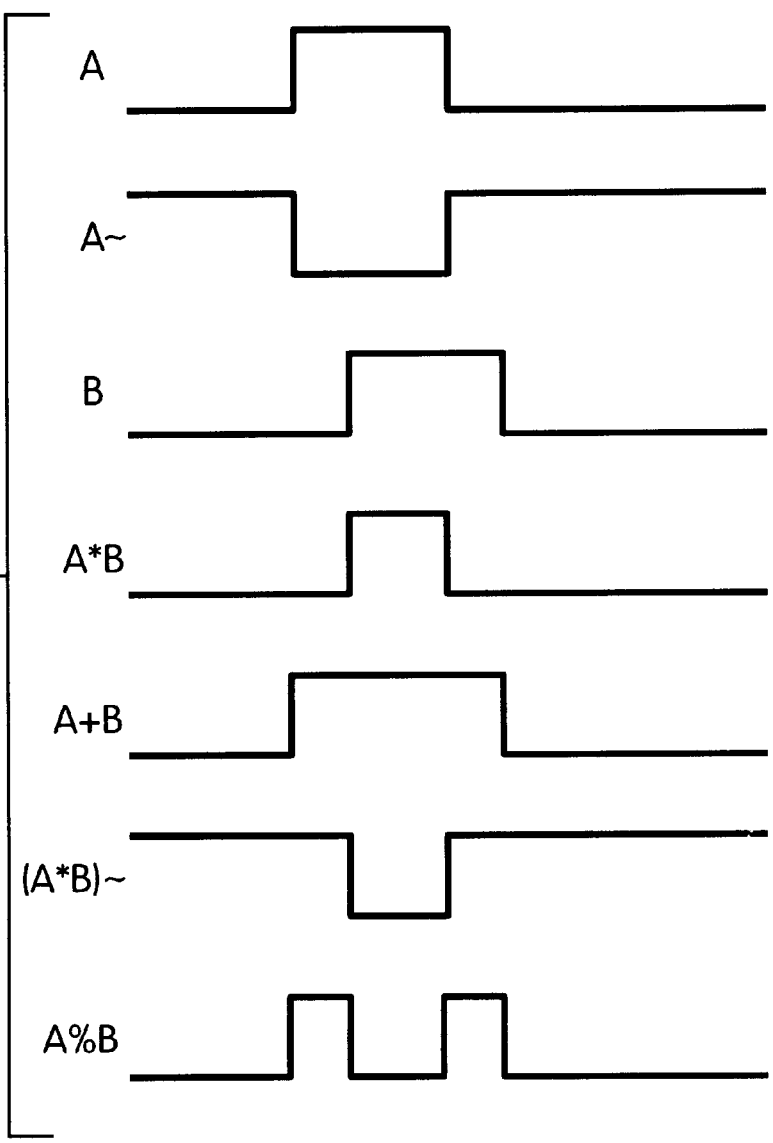
FIG. 3 is a timing diagram for signals showing Boolean operations of the system in accordance with the present invention.
Figure 4:
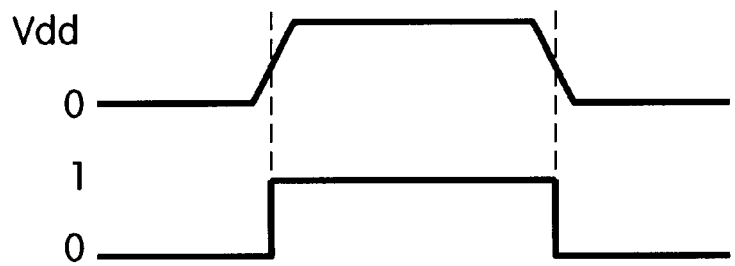
FIG. 4 is a timing diagram showing signal comparisons for transitions in transmitted signals in accordance with the present invention.

Referring to FIGS. 3 and 4, functions in the first group perform Boolean operations on circuit waveforms as illustrated in FIG. 3 to extract timing information such as pulse widths and transition crossing points that can be used in formulas for object sizing updates (FIG. 4). These Boolean expressions are evaluated from left to right. Table 1 illustrates some Boolean operators supported by the system.

TABLE 1

| OPERATOR | MEANING |
|---|---|
| ~ | complement |
| * | and |
| + | or |
| % | exclusive or |

The second group of library functions directly extracts quantities such as 10%–90% of transition times (slews) etc. without the use of Boolean operations. 10%–90% of transition times is preferably chosen to evaluate slews since it is in this range that the signal undergoes the least amount of parasitic perturbations. In both the 0%–10% and the 90%–100% ranges of transition times, the devices/gates are in a weak regime and do not reflect normal switching conditions. Some illustrative table functions for extracting measurements from ASX simulation data include the following:

pulseWidth (expression) Measures the width of the first pulse on the Boolean waveform represented by expression. This function is often used for computing delays. As an example, to measure the delay through an inverter with input A output Y for the first falling transition on Y the following function call is used:

$$pulseWidth(A*Y)$$

The expression A*Y returns a Boolean waveform with a pulse of width equal to the desired delay. The pulseWidth( ) function then measures and returns the width of that pulse. As another example, to measure the delay through a 2-input NAND gate with inputs A and B and output Y for the first falling transition on Y the following function call is used:

$$pulseWidth\ (A*B*Y)$$

If a measure is desired of the delay through the NAND gate for the first rising transition on Y in which only one of the inputs A and B is falling, the following function call is used:

$$pulseWidth(A\%B*(Y^-))$$

Note that the argument to pulseWidth( ) is preferably evaluated from left to right.

pulseWidth (expression, n) Measures the width of the n-th pulse on the Boolean waveform represented by expression.

pulseWidth (expression, $t_1$, $t_2$) Measures the width of the first pulse on the Boolean waveform represented by expression occurring within the interval $t_1 \leq t < t_2$.

slew (node, polarity) Measures the 10%–90% slew of the first transition on node node. The parameter node is preferably the exact name of the node in a ASX.grf1 output file (not necessarily the same as in the Cadence schematic) if such systems are used. The parameter polarity is chosen according to Table 2:

TABLE 2

| Value | Transition |
|---|---|
| 1 | rising |
| −1 | falling | slew (node, polarity, n) Measures the 10%–90% slew of the n-th transition on node node.

slew (node, polarity, $t_1$, $t_2$) Measures the 10%–90% slew of the first transition on node node occurring within the interval $t_1 \leq t < t_2$.

edge (expression, polarity) Measures the 50% crossing time of the first transition on the Boolean waveform represented by expression. The parameter polarity is chosen according to Table 2.

edge (expression, polarity, n) Measures a 50% crossing time of the n-th transition on the Boolean waveform represented by expression.

edge (expression, polarity, $t_1$,$t_2$) Measures the 50% crossing time of the first transition on the Boolean waveform represented by expression occurring within the interval $t_1 \leq t < t_2$.

Tuning Formulas

The present system permits a designer to attach formulas to a schematic indicating the tuning to be performed. A general form of a tuning formula is:

$$instance\ parameter = expression$$

where instance is the name of the instance to be tuned (for example, a transistor or p-cell), parameter is the name of the sizing parameter associated with that instance that is to be adjusted during the tuning process, and expression is any valid SKILL expression containing any of the ASX simulation measurement functions listed above.

The following additional functions for use in tuning formulas may be included:

par (parameter) Returns the value of parameter for the current instance.

par (instance.parameter) Returns the value of parameter for instance instance.

update (min, max, expression) Multiplies the current value of parameter by expression and constrains the result to be greater than min and less than max.

Referring again to FIG. 2, form 20 is shown for implementing the present invention. To set up the system for a tuning session using a software application, the following steps may be implemented:

1. Locate a start up file.
2. Load the software application in SKILL code by typing one of the commands, for example load (executable path) followed by an executable command to open the software application. When the program is loaded, form 20 shown in FIG. 2 preferably pops up.
3. Click on Schematic 22 in the Select button row 24 and then on a window which pops up containing the schematic diagram of the circuit to be tuned as selected from a file list or a library of schematics.
4. Fill in the ASX library path field 26 and ASX loadlib modules field 28 for your particular project, location and technology. These values may be obtained from a log file or Cadence CIW (Command Interpreter Window)after running an ASX simulation on the circuit to be analyzed.
5. Fill in the ASX netlist field 30 with the full path name of the ASX netlist corresponding to the current schematic. This netlist is fully self-contained. A net list is fully self-contained if all circuit information (for example, nodes, connections, networks, devices, etc.), all the run control features (input stimuli) and print statements are in the same physical file.
6. Fill in the ASX output field 32 with the full path name of an ASX output file which outputs a graphical output schematic in accordance with the present invention.
7. Fill in the ASX options field 34 with any run options to be passed to ASX. This field is optional and may be left blank.
8. The other fields such as rounding 36, Vdd 38, Max # Iterations 40, Instance prefix 42 and FET scale factor 44 may be selected by the user or predetermined based on the analysis program being used. These fields may be filled in for different analysis tools. One group of setting are illustrated in Table 3.

TABLE 3

| Field | G5 mainframe |
| --- | --- |
| Instance prefix | X |
| FET scale factor | 1e6 |
| Vdd | NVDD |
| Rounding | 0.05 u |

G5 mainframe is a commercially available product of IBM, Inc. Values in rounding 36 and max # iterations 40 permit the user to adjust the accuracy of the results of the calculations performed in tuning the circuit. Likewise a supply voltage, Vdd 38, may be set according to the user to change the circuit characteristics. FET scale factor 44 permits the user to adjust field effect transistor scaling, and instance prefix 42 provides an indication of instances within the schematic diagram of the circuit to be analyzed.

9. Click on Save 46 in the Setup button row 48 to save these settings to the schematic, then save the schematic.

10. Click on Run ASX 50 in the Actions button row 52 to perform a test run of ASX with the settings.

The next time the system is used on the present schematic, a Recall button 54 in the Setup button row 48 may be used to recall the settings entered for that schematic.

Further functions and features of the system of the present invention will be described with reference to several illustrative examples. Although described in terms of these examples, the invention is much broader and is adaptable to other circuits and scenarios other than those illustrated herein.

Tuning for Delay

Figure 5:
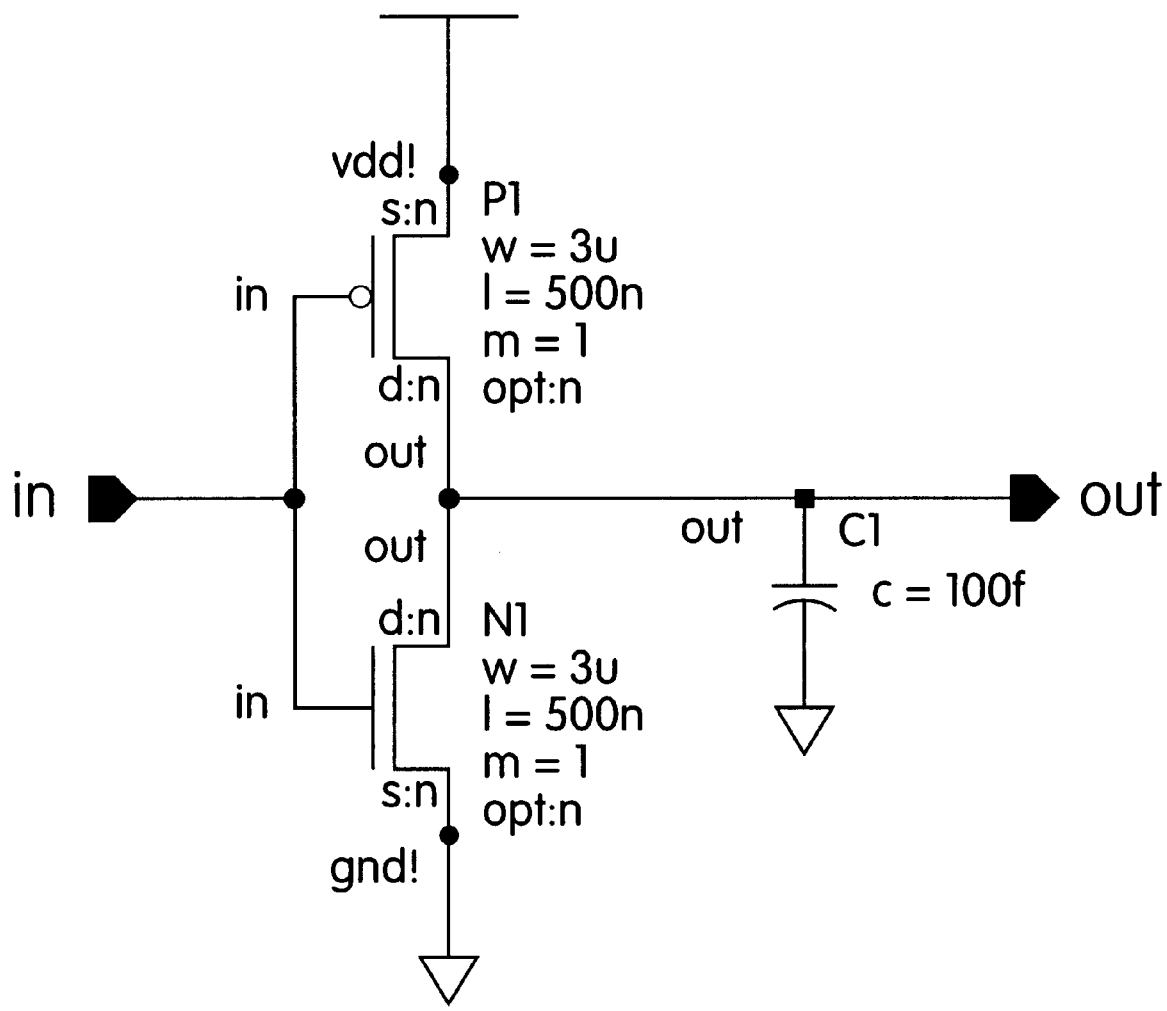
FIG. 5 is a schematic diagram showing a transistor circuit to be tuned in accordance with the present invention.

For a first illustrative example a circuit will be tuned for delay according to the following steps:

1. Construct a schematic as shown in FIG. 5.
2. Click on Formulas 56 in the Edit button row 58. This action initiates a text editor application. The following tuning formulas are entered to define physical characteristics of instance N1 and P1 (transistors in this example) shown in the schematic of FIG. 5:

N1 w=update(2 u, 100 u, pulseWidth(NIN*NOUT)/0.070)

P1 w=update(2 u, 100 u, pulseWidth((NIN⁻)*(NOUT~~))/0.070)

The first formula tells the system to update the value of parameter w for instance N1 as present value of w times the measured width of the first pulse on the Boolean waveform N1*NOUT divided by 0.070 and constrain the resulting size to be greater than 2 $\mu$m (2 u)and less than 100 $\mu$m (100 u). In short, this formula tells the system to tune the width, w, of N1 such that the delay through N1 is 70 ps. If the measured delay is less than 70 ps, the width of N1 will be increased, else it will be decreased. When the measured delay is exactly 70 ps, the width of N1 will not change. The second formula accomplishes the same effect for P1.

3. Click on Measurements 60 in the Edit button row 58. The following measurement formulas may be entered:

pulseWidth(NIN*NOUT)

pulseWidth((NIN~)*(NOUT))

4. Save the schematic to save the tuning and measurement formulas entered above by clicking on save 46.
5. Set the maximum number of iterations, to 10 in this example, and click on Tune 62 to execute. When the tuning is completed, click on Measure 64 to display the updated measurements for the circuit shown in FIG. 5. Both delays are shown at almost exactly 70 ps. Further, the transistor sizes of transistors N1 and P1 have been automatically updated in the schematic.

The system will continue to iterate during the tuning process until either none of the tuning formulas changes value or the maximum number of iterations is reached. Roundoff "noise" in the ASX simulation results may prevent the system from terminating before the maximum iteration count is reached. Values of specified measurements are preferably checked after each run. If the measurements are not acceptable and additional tuning is needed, the designer may renetlist the current schematic with the updated device sizes and repeat the tuning process.

6. Click on Round Sizes 66 in the Actions button row 52 to snap the resulting transistor widths to a desired grid. The grid has integer sized regions which are preferable to standardize instance sizes.

In another illustrative example, if the tuning formulas, for the circuit in FIG. 5, are changed to:

N1 w=update(2 u, 100 u, pulseWidth(NIN*NOUT, 2)/0.070)

P1 w=update(2 u, 100 u, pulseWidth((NIN~)*(NOUT~), 2)/0.070)

and the measurement formulas to pulseWidth(NIN*NOUT, 2)

pulseWidth((NIN~)*(NOUT), 2)

where the second argument (2) to the pulseWidth( ) function tells the system to measure the width of the second pulse found in the Boolean waveforms NIN*NOUT and (NIN~)*(NOUT). A click on Tune 62 to re-tune the circuit would show different results since the final transistor sizes would be different than before due to the fact that the second input pulse has a larger slew than the first input pulse.

Tuning for Slew

In another illustrative example, the system may tune for slew as follows:

1. The tuning formulas are set for the instances N1 and P1 of FIG. 5

N1 w=update(2 u, 100 u, slew(NOUT, −1)/0.100)

P1 w=update(2 u, 100 u, slew(NOUT, 1)/0.100)

The first formula informs the system to update the value of parameter w for instance N1 as present value of w times the measured slew of the first falling transition (−1, the second argument to slew( )) on waveform NOUT divided by 0.100. In short, this formula tells the system to tune the width of N1 such that the slew on the first falling edge of NOUT is 100 ps. If the measured slew is less than 100 ps, the width of N1 will be increased, else it will be decreased. When the measured slew is exactly 100 ps, the width of N1 will not change. The second formula accomplishes the same effect for P1.

2. The measurement formulas include:

slew(NOUT, −1)

slew (NOUT, 1)

3. Set the maximum number of iterations, to 10, for this example, and tune the circuit. Both slews are tuned to 100 ps.

In another illustrative example, different references may be used for slew to tune the circuit. The tuning formulas may be changed as follows:

N1 w=update(2 u, 100 u, slew(NOUT, −1, 2)/0.100)

P1 w=update(2 u, 100, slew(NOUT, 1, 2)/0.100)

and the measurement formulas are:

slew(NOUT, −1, 2)

slew(NOUT, 1, 2)

where the second argument (2) to the slew( ) function tells the system to measure the slew of the second rising or falling (1 or −1) transition found on NOUT. The circuit may be retuned based on the second rising or falling transition. The schematic is automatically updated with the results. A clear button 68 is included to clear a field or settings previously entered.

Tuning for Delay and Slew

Circuits may be tuned for both delay and slew simultaneously. This feature is employed by making design decisions on the desired constraints of the circuit to be tuned. Using the circuit in FIG. 5, slew for P1 and delay for N1 are selected.

1. The tuning formulas for the instances of FIG. 5 become:

N1 w=update(2 u, 100 u, pulseWidth(NIN*NOUT)/0.070)

P1 w=update(2 u, 100 u, slew(NOUT, 1)/0.100)

and the measurement formulas are:

pulseWidth(NIN*NOUT)

slew (NOUT, 1)

The circuit in FIG. 5 is now tuned for both delay and slew according user defined criteria which advantageously provides a more user friendly and powerful design tool.

Tuning Complex Gates

In another illustrative example of the system of the present invention, a circuit is tuned having complex gates.

Figure 6:
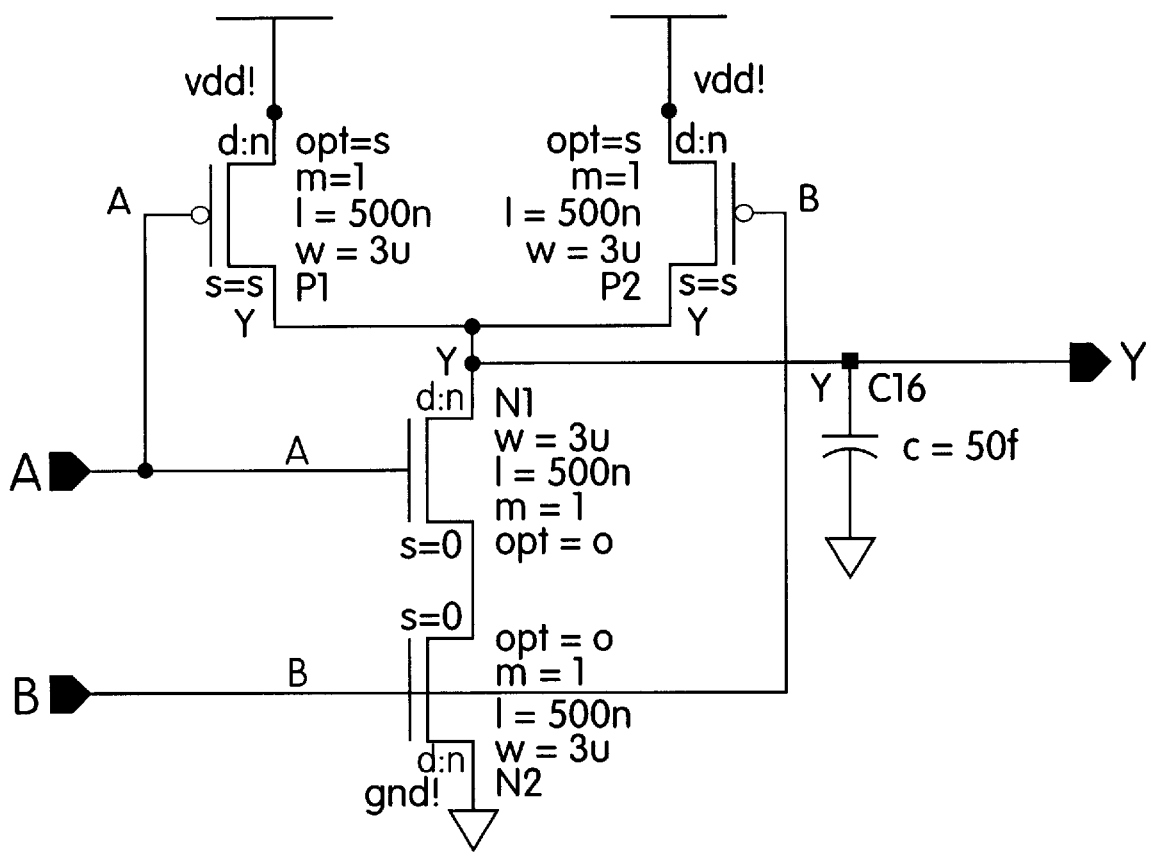
FIG. 6 is a schematic diagram showing a complex gate to be tuned in accordance with the present invention.

1. A schematic diagram of the circuit shown in FIG. 6 is constructed.

2. An ASX configuration file for this circuit is updated.

3. The following ASX stimuli is defined for the circuit in FIG. 6 (written in SKILL):

EVDD, GND−VDD=(PVDD)

The above is the general form of the input ASX stimuli. ASX stimuli represents generic input signals at the input of the considered circuit. The ASX stimuli may be read from a library file (see description of form 20 in FIG. 2 for loading ASX files) or programmed directly as desired. The inputs are further defined below in a sinusoidal waveform (SINSQ) having features as shown in the parenthesis which are known to those skilled in the art. SINSQ ( ) returns a train of pulses with a sine-squared rise and fall according to a predefined function describing a waveform. SINSQ( ) is generally defined as SINSQ (t1, t2, t3, t4, tp, h1, h2) where the arguments are:

t1 delay to first breakpoint;

t2 delay to second breakpoint;

t3 delay to third breakpoint;

t4 delay to fourth breakpoint;

tp delay to periodic repetition starting with the first breakpoint;

h1 original value of function, prior to first breakpoint; and h2 second value of function, after the first breakpoint.

Inputs A and B are shown in FIG. 6 and receive the stimuli as programmed by the following:

To input A:

EA, GND−A=(SINSQ(1, 1.15, 1.5, 1.65, 1000, 0, PVDD)+
    SINSQ(2.0, 2.15, 2.5, 2.65, 1000, PVDD))

To input B:

EB, GND−B=(SINSQ(1, 1.15, 1.5, 1.65, 1000, 0, PVDD)+
    SINSQ(2.1, 2.25, 3.1, 3.15, 1000, 0, PVDD))

4. The circuit in FIG. 6 is tuned according to the following tuning formulas:

N1 w=update(2 u, 100 u, pulseWidth(NA*NB*NY)/0.070)

N2 w=par(N1.w)

P1 w=update(2 u, 100 u, pulseWidth(((NA~)+
    (NB~))*(NB~))*(NY~), 2)/0.070)

P2 w=par(P1.w)

The second formula (N2) tells the system to assign the value of parameter w for instance N1 to the value of parameter w for instance N2. Note that the formulas are preferably evaluated in the order in which they are specified. If the order of the first and second formulas were changed, N1 and N2 may have different values of w after the evaluation. Also of note, p-channel transistors (P1 and P2) may be tuned on the second evaluation of their gates (instead of the first) such that the input stimulus ensures that both P1 and P2 do not turn on at the same time (the worst case).

5. The following measurement formulas are included:

pulseWidth(NA*NB*NY)

pulseWidth(((NA~)+(NB~))*(NY~), 2)

6. Tune the circuit by clicking on Tune 64 of FIG. 2. The schematic is automatically updated with the results. The results of tuning meet the desired specifications as defined by the user in the equations (i.e., 70 ps delay). The final device sizes are also very acceptable.

Tuning Parameterized Subcircuits

In another illustrative example of the system of the present invention, a circuit is tuned having parameterized subcircuits.

Figure 7:
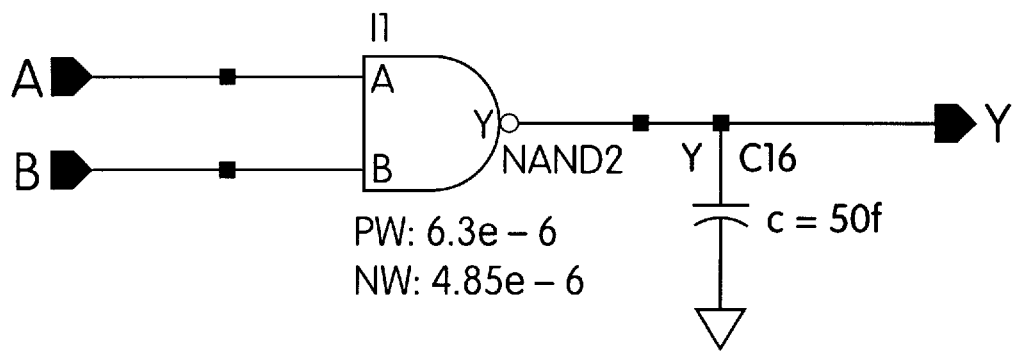
FIG. 7 is a schematic diagram showing a parameterized subcircuit to be tuned in accordance with the present invention.

1. A schematic diagram of the circuit shown in FIG. 7 is constructed.
2. The ASX configuration file for this circuit is updated.
3. The following ASX stimuli is input similarly as in the previous example:

EVDD, GND−VDD=(PVDD)

EA, GND−A=(SINSQ(1, 1.15, 1.5, 1.65, 1000, 0, PVDD)+
    SINSQ(2.0, 2.15, 2.5, 2.65, 1000, 0, PVDD))

EB, GND−B=(SINSQ(1, 1.15, 1.5, 1.65, 1000, 0, PVDD)+
    SINSQ(2.1, 2.25, 3.1, 3.15, 1000, 0, PVDD))

4. The following tuning formulas are entered.

I1 PNW=update(2 u, 100 u, pulseWidth(NA*NB*NY)/0.070)

I1 PPW=update(2 u, 100 u, pulseWidth(((NA~)+(NB~))*(NY~),
    2)/0.070)

5. The following measurement formulas are included:

pulseWidth(NA*NB*NY)

pulseWidth(((NA~)+(NB~))*(NY~), 2)

6. Tune the circuit by clicking on Tune 64 of FIG. 2. The schematic is automatically updated with the results PW and NW for instance I1 (A NAND gate). PW and NW represent the tuned widths of the components in the circuit based on delay constraints input from the tuning formulas and the measurement formulas. The measurement formulas given above are based on the boolean representation of a logical function of the gate being tuned. The final values of the tuned parameters to achieve the desired specification are shown in FIG. 7 (i.e. PW=6.3 and NW=4.85).

A Complete Illustrative Example

Figure 8:
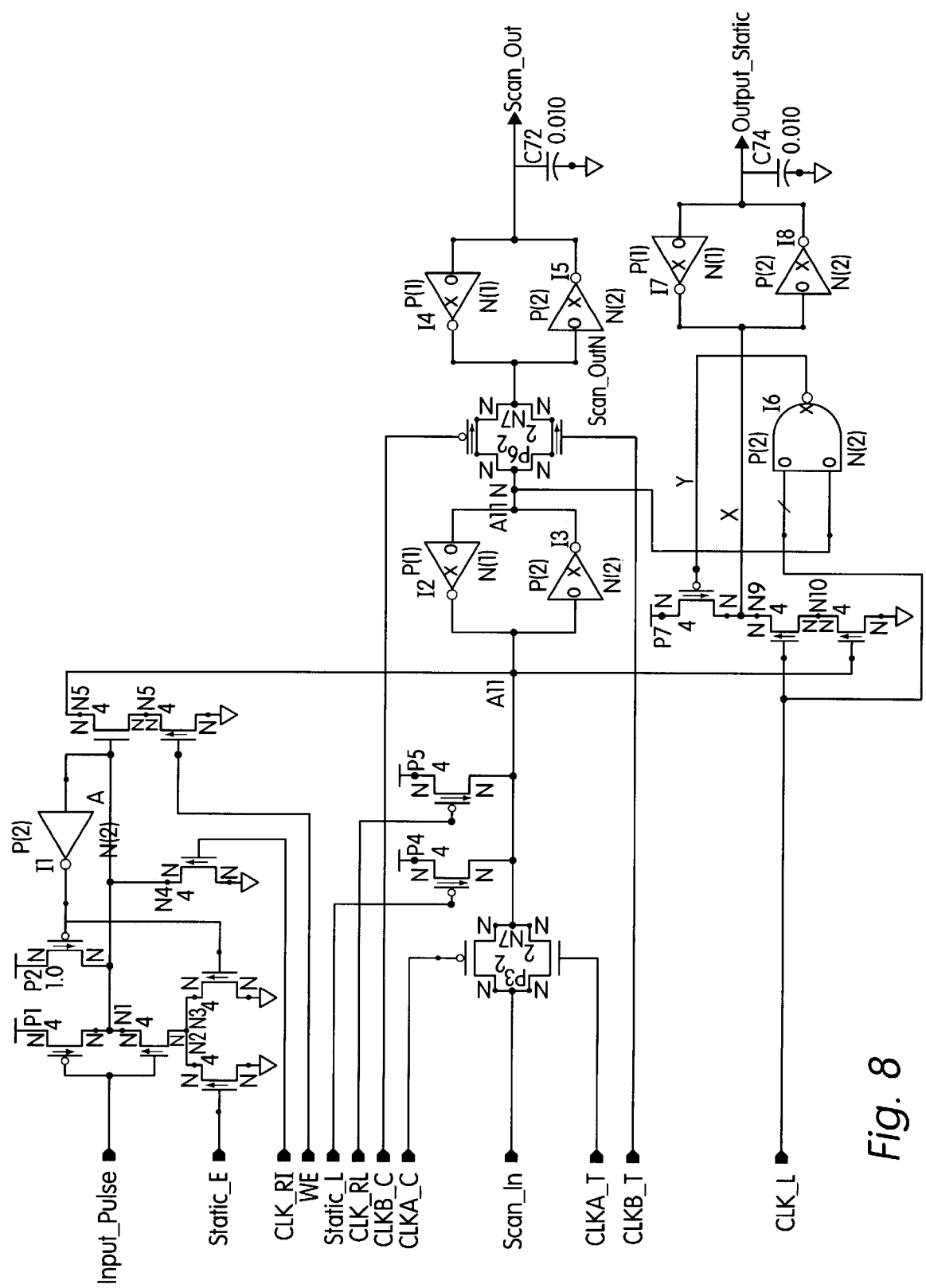
FIG. 8 is a schematic diagram showing a complex circuit to be tuned in accordance with the present invention.

A dynamic pulse-to-static latch circuit is shown in FIG. 8. FIG. 8 is shown with CMOS8S technology. The initial condition for the circuit is shown in Table 4:

TABLE 4

| Node | State |
| --- | --- |
| Input_Pulse | high |
| A | low |
| A11 | high |
| A11N | low |
| Y | high |
| X | low |
| Output_Static | high |

In an evaluate part of the cycle node transitions are as shown in Table 5.

TABLE 5

| Node | Transition |
| --- | --- |
| Input_Pulse | fall |
| A | rise |
| A11 | fall |
| A11N | rise |
| CLK_L | rise |
| Y | fall |
| X | rise |
| Output_Static | fall |

In a reset part of the cycle the node transitions are as shown in Table 6.

TABLE 6

| Node | Transition |
| --- | --- |
| CLK_RI | rise |
| A | fall |
| CLK_RL | fall |
| A11 | rise |
| A11N | fall |
| Y | rise |

The ASX input stimuli are

Evdd, gnd−vdd=(pvdd)

PINIT=(SINSQ(0.0, 0.1, 1000, 2000, 3000, 0, PVDD))

ECLKA_=C, GND-CLKA_C=(PVDD)

ECLKB_C, GND-CLKB_C=(PVDD)

ECLK_RL, GND-CLK_RL=(PINIT-SINSQ(1.6, 1.7, 1.8, 1.9, 2.6, 0, PVDD))

ECLKA_T, GND-CLKA_T=(0.0)

ECLKB_T, GND-CLKB_T=(0.0)

ECLK_L, GND-CLK_1=(PVDD-PINIT+SINSQ(1.25, 1.35, 1.45, 1.55, 2.25, 0, PVDD))

ECLK_RI, GND-CLK_RI=(PVDD-PINIT+SINSQ(1.65, 1.75, 1.85, 1.95, 2.65, 0, PVDD))

EStatic_E, GND-Static_E=(0.0)

EInput_Pulse, GND-Input_Pulse=(PVDD-SINSQ(1.1, 1.2, 1.4, 1.5, 1000, 0, pvdd)-SINSQ(3.1, 3.2, 3.5, 3.6, 1000, 0, pvdd))

EStatic_L, GND-Static_L=(PVDD)

EWE, GND-WE=(PVDD)

EScan_in, GND-Scan_in=(0.0)

(These signal names are generic and typical for a SRCMOS circuit. The signal names are recognizable to one skilled in the art.) The cycle time is 1.0 ns and the falling edge of Input_Pulse occurs at 150 ps into the cycle. The rising edge of CLK_L occurs at 300 ps into the cycle. A setup time of 30 ps for the latch driving Output-Static is used, this leaves 120 ps for the falling edge of Input-Pulse to propagate through the circuit and bring A11 high. Furthermore, it is preferable to have the data appear on Output_Static no longer than 120 ps after the rising edge of CLK_L arrives. To accomplish these targets, the delays of all of the stages in the circuit to are set to 40 ps each as shown in the tuning formulas below:

P1 pw=update(2, 100, pulseWidth((INPUT_PULSE~)*(A~))/ 0.040)

N4 pw=update(2, 100, pulseWidth(CLK_RI*A, 2)/0.040)

N5 pw=update(2, 100, pulseWidth(A*WE*A11)/0.040)

N6 pw=par(N5.pw)

P5 pw=update(2, 100, pulseWidth((CLK_RL~)*(A11~), 2)/0.040)

I3 pwPA=update(2, 100, pulseWidth((A11~)*(A11N~))/0.040)

I3 pwNA=update(2, 100, pulseWidth(A11*A11N)/0.040)

I6 pwNA=update(2, 100, pulseWidth(CLK_L*A11N*Y)/0.040)

I6 pwNB=par(pwNA)

I6 pwPA=update(2, 100, pulseWidth((CLK_L%A11N)*(Y~))/ 0.040)

I6 pwPB=par(pwPA)

N9 pw=update(2, 100, pulseWidth(CLK_L*A11*X)/0.040)

N10 pw=par(N9.pw)

p7 pw=update(2, 100, pulseWidth((Y~)*(X~))/0.040)

18 pwNA=update(2, 100, pulseWidth(X*OUTPUT_STATIC)/ 0.040)

18 pwPA=update(2, 100, pulseWidth((X~)*(OUTPUT_STATIC~))/0.040)

The measurements on the simulation results are pulseWidth((INPUT_PULSE)*(A~))

pulseWidth(CLK_RI*A, 2)

pulseWidth(A*WE*A11)

pulseWidth((CLK_RL~)*(A11~), 2)

pulseWidth((A11~)*(A11N~))

pulseWidth(A11*A11N)

pulseWidth(CLK_L*A11N*Y)

pulseWidth((CLK_L%A11N)*(Y~))

pulseWidth(CLK_L*A11*X)

pulseWidth((Y~)*(X~))

pulseWidth(X*OUTPUT_STATIC)

pulseWidth((X~)*(OUTPUT_STATIC~))

edge (CLK_L, 1)-edge (A11N, 1)

edge(OUTPUT_STATIC, -1)-edge(INPUT_PULSE, -1)

edge(OUTPUT_STATIC, -1)-edge(CLKL, 1)

The measurement:

edge (CLK_L, 1)-edge(A11N, 1)

measures the setup time of the output latch while the measurement:

edge(OUTPUT_STATIC, -1)-edge(CLK_L, 1)

measures the delay from the rising edge of CLK_L to the active edge of Output-Static. The original measurements on the untuned circuit are shown below in Table 7.

TABLE 7

| Measurement | Value |
| --- | --- |
| pulseWidth ((INPUT_PULSE~) * (A~)) | 0.047697 |
| pulseWidth (CLK_RI*A, 2) | 0.02564005 |
| pulseWidth (A*WE*A11) | 0.04744928 |
| pulseWidth ((CLK_RL~) * (A11~) ,2) | 0.1245668 |
| pulseWidth ((A11~) * (A11N~)) | 0.06920976 |
| pulseWidth (A11*A11N) | 0.04459126 |
| pulseWidth (CLK_L*A11N*Y) | 0.04243601 |
| pulseWidth ((CLK_L%A11N) * (Y~)) | 0.04522299 |
| pulseWidth (CLK_L*A11*X) | 0.02844473 |
| pulseWidth ((Y~) * (X~)) | 0.07518818 |
| pulseWidth (X*OUTPUT_STATIC) | 0.0622872 |
| pulseWidth ((X~) * (OUTPUT_STATIC~)) | 0.09177936 |
| edge (CLK_L, 1) -edge (A11N, 1) | −0.0014358 |
| edge(OUTPUT_STATIC, −1) -edge(INPUT_PULSE, −1) | 0.344267 |
| edge (OUTPUT_STATIC, −1) -edge (CLK_L,1) | 0.194269 |

This example may be run using a maximum iteration count of 20. The circuit is now tuned by the system of the present invention, all delays are tuned to about 40 ps and the setup times to about 30 ps as shown in the measurement Table 8.

TABLE 8

| Measurement | Value |
|---|---|
| pulseWidth ((INPUT_PULSE~) * (A~)) | 0.0400137 |
| pulseWidth (CLK_RI*A,2) | 0.04001707 |
| pulseWidth (A*WE*A11) | 0.04000442 |
| pulseWidth ((CLK_RL~) * (A11~) ,2) | 0.0400085 |
| pulseWidth ((A11[) * (A11N~)) | 0.03994568 |
| pulseWidth (A11*A11N) | 0.03995516 |
| pulseWidth (CLK_L*A11N*Y) | 0.03999604 |
| pulseWidth ((CLK_L%A11N) * (Y~)) | 0.03999301 |
| pulseWidth (CLK_L*A11*X) | 0.04001981 |
| pulseWidth ((Y~) * (X~)) | 0.04003714 |
| pulseWidth (X*OUTPUT_STATIC) | 0.0400014 |
| pulseWidth (X~) * (OUTPUT_STATIC~)) | 0.04001103 |
| edge (CLK_L,1) -edge (A11N,1) | 0.030032 |
| edge(OUTPUT_STATIC, -1) -edge(INPUT_PULSE, -1) | 0.27003 |
| edge(OUTPUT_STATIC, -1) -edge(CLK_L,1) | 0.120035 |

Figure 9:
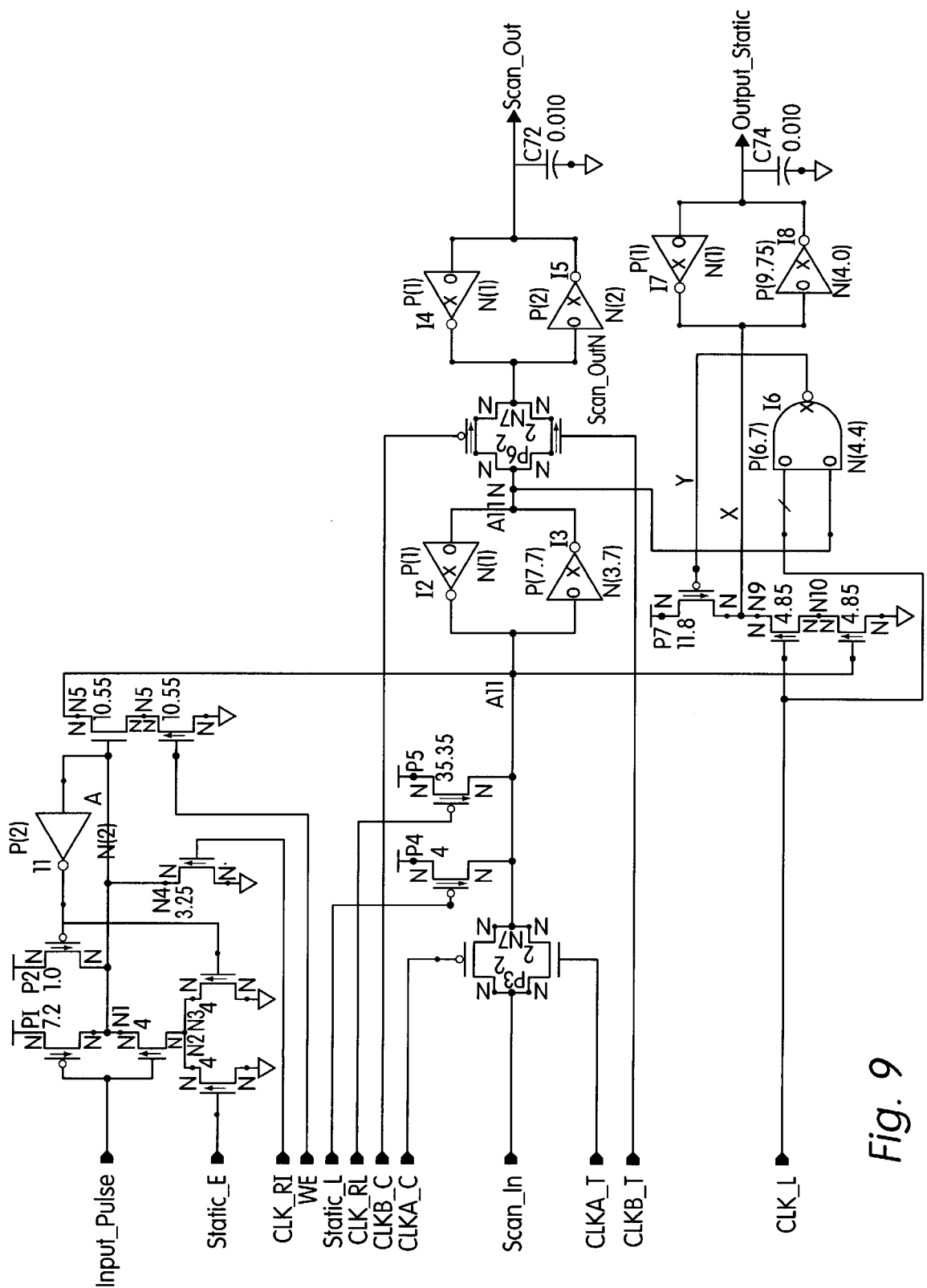
FIG. 9 is a schematic diagram showing the complex circuit of FIG. 7 after tuning in accordance with the present invention.

The schematic diagram of the final tuned circuit is automatically updated and shown in FIG. 9.

Enhancements to the system include an expansion to the ASX simulation measurement function library for analog and noise measurements. These noise measurement functions may then be used by the system in sizing formulas to size circuits with noise constraints.

Figure 10:
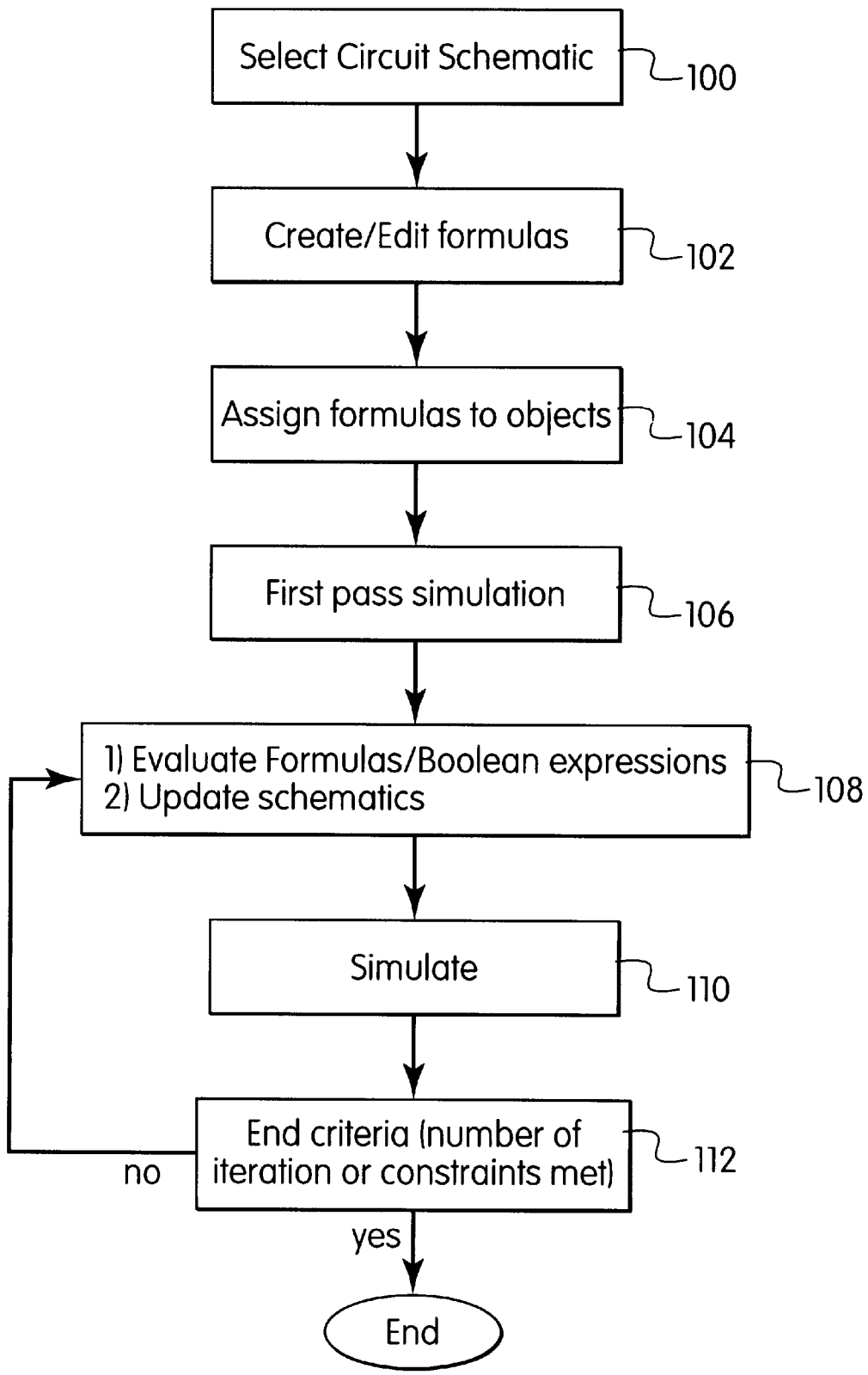
FIG. 10 is a block/flow diagram showing a method and apparatus in accordance with the present invention.

Referring to FIG. 10, a flow/block diagram is shown for the system and method for automatically tuning object sizes in an integrated circuit to satisfy timing and/or slew constraints in accordance with the present invention. In a block 100, a schematic diagram representing a circuit is selected. The selection of the schematic may be from a menu list or preliminary circuit designs generated by various schematic generation tools, for example computer aided design tools. The schematic diagrams include objects or instances which are recognizable as electrical components within the circuit, for example transistors, capacitors, etc. In a block 102, formulas are created by the user or exist in a built-in library. Formulas are created via a text or equation editor and edited and transferred onto form 20 as described above. The method uses Boolean expressions to represent timing constraints on selected objects (devices and/or gates)(as described above in the illustrative examples). These expressions are added and defined by the user, through the user interface (form 20 of FIG. 2) provided with the system. The system uses arbitrary sizing and update formulas to define points of interest within the circuit to be analyzed and to update the points of interest to provide an analysis of the circuit under various conditions. In a block 104, formulas are attached to instances or objects to place physical requirements on the circuit being designed.

In a block 106, a first pass simulation is performed to determine circuit characteristics and initialize parameters. For example, a timing analysis and simulation data (ASX) are used to evaluate the present state of a circuit to be tuned prior to a full blown analysis.

In a block 108, formulas and Boolean expressions are evaluated for the objects. An imaginary pulse may be used to represent the logic being described by the above Boolean expressions. The imaginary pulse is used to add constraints for spreading signals and to "measure" spacing between transitions on signals, real or not. It may, in some situations, be optimum to tune a gate based on non-real signal to achieve better setup time, for example in dynamic gates. This concept is different from the pulse modeling concept used in other tools, since it is linked to arbitrary Boolean expressions. This approach can be used for mixed analog/digital circuits since it uses the most precise circuit modeling and simulation tools available, for example, ASX. In a preferred embodiment, power and noise evaluation expressions are included in the tuning expressions/formulas. Also in block 108, schematics are updated according to the evaluated formulas and Boolean expressions.

In block 110, a simulation is run wherein all the formulas and expressions are combined to yield tuned circuits according timing delay and slew. In block 112, the results of the simulation are analyzed against user defined criteria. If the criteria is met the method ends. The method also ends if the maximum number of iterations has exceeded the number of a user defined number of maximum iteration (Max # iterations (FIG. 3)). If one of these conditions does not exist the method path returns to block 108 to reevaluate the formulas and expressions, update schematics and resimulate the circuit. Implementation of the method of the present invention has resulted in a reduction in circuit tuning time by about several orders of magnitude, for example from weeks to minutes.

What is claimed is:

1. A method for automatically tuning object sizes for an integrated circuit comprising the steps of:

providing a circuit having objects disposed therein, the objects including electrical components to be sized in the integrated circuit;

inputting equations associated with each of the objects to provide tuning adjustment for sizes of the objects;

assigning boolean expressions to selected objects to represent timing constraints on the selected objects;

evaluating the equations and the expressions to simulate the circuit in operation including measuring spacings between transitions on signals transmitted within the circuit to provide adjustments to the sizes of the objects in the circuit according to the spacings; and adjusting the sizes of the objects in the circuit until user defined criteria are achieved for the circuit.

2. The method as recited in claim 1, wherein the step of evaluating includes the step of evaluating slew according to the expressions.

3. The method as recited in claim 1, wherein the step of evaluating includes the step of evaluating signal delay between objects according to the equations.

4. The method as recited in claim 1, wherein the step of assigning Boolean expressions includes the step of representing the Boolean expressions by a simulated pulse, the simulated pulse compensating for signal spreading.

5. The method as recited in claim 1, wherein the circuit includes analog and digital objects.

6. The method as recited in claim 1, wherein the objects include transistors.

7. The method as recited in claim 1, wherein the objects include parameterized subcircuits.

8. The method as recited in claim 1, further comprising the step of automatically updating a schematic diagram for the circuit according to the adjusted sizes of the objects.

9. A program storage device readable by machine, tangibly embodying a program of instructions executable by the machine to perform method steps as recited in claim 1.

10. A method for automatically tuning object sizes in an integrated circuit comprising the steps of:

providing a circuit having objects disposed therein, the objects including electrical components to be sized in the integrated circuit;

inputting equations associated with each of the objects to provide a relationship between a size of the object and timing information of signals transmitted between the objects including measuring spacings between transitions on the signals transmitted within the circuit to provide adjustments to the sizes of the objects in the circuit according to the spacings;

extracting transition times of the signals transmitted between objects by simulating the circuit in operation by evaluating the equations; and adjusting the sizes of the object in the circuit according to the timing information and the transition times until user defined criteria are achieved for the circuit.

11. The method as recited in claim 10, wherein evaluating the equations includes the step of evaluating slew according to the equations.

12. The method as recited in claim 10, wherein the step of inputting equations includes the step of evaluating signal delay between objects according to the equations.

13. The method as recited in claim 10, wherein the step of extracting transition times includes the step of providing a simulated pulse between objects to represent Boolean expressions, the simulated pulse compensating for signal spreading.

14. The method as recited in claim 10, wherein the circuit includes analog and digital objects.

15. The method as recited in claim 10, wherein the objects include transistors.

16. The method as recited in claim 10, wherein the objects include parameterized subcircuits.

17. The method as recited in claim 10, further comprising the step of automatically updating a schematic diagram for the circuit according to the adjusted sizes of the objects.

18. A program storage device readable by machine, tangibly embodying a program of instructions executable by the machine to perform method steps as recited in claim 10.

19. A system for automatically tuning sizes of objects for an integrated circuit comprising:

means for inputting equations associated with each of the objects to provide tuning adjustment for sizes of the objects, the objects including electrical components to be sized in the integrated circuit;

means for assigning boolean expressions to represent timing constraints on selected objects, the timing constraints including spacings between transitions on signals transmitted within the circuit, the spacings being utilized to provide adjustments to the sizes of the objects in the circuit; and computing means for evaluating the equations and the expressions to simulate the circuit in operation until user defined criteria are achieved for the circuit.

20. The system as recited in claim 19, wherein the timing constraints include spacing differences between pulse widths of transmitted signals between the objects.

21. The system as recited in claim 19, wherein the timing constraints include spacing differences between predetermined transition points on transmitted signals between the objects.

22. The system as recited in claim 19, wherein the timing constraints include delay and slew between the objects.

23. The system as recited in claim 19, wherein the circuit includes analog and digital objects.

24. The system as recited in claim 19, wherein the objects include transistors.

25. The system as recited in claim 19, wherein the objects include parameterized subcircuits.

26. A system for automatically tuning sizes of objects in an integrated circuit comprising:

means for inputting equations, the equations being associated with individual objects to provide a relationship between a size of the object and timing information of signals transmitted between the objects, the objects including electrical components to be sized in the integrated circuit;

means for extracting transition times of the signals transmitted between objects by simulating the circuit in operation by evaluating the equations, the transition times including spacings between transitions on signals transmitted within the circuit, the spacings being utilized to provide adjustments to the sizes of the objects in the circuit; and means for adjusting the sizes of the objects in the circuit according to the timing information and the transition times until user defined criteria are achieved for the circuit.

27. The system as recited in claim 26, wherein the transition times includes spacing differences between pulse widths of transmitted signals between the objects.

28. The system as recited in claim 26, wherein the transition times include spacing differences between predetermined transition points on transmitted signals between the objects.

29. The system as recited in claim 26, wherein the timing information includes delay and slew between the objects.

30. The system as recited in claim 26, wherein the circuit includes analog and digital objects.

31. The system as recited in claim 26, wherein the objects include transistors.

32. The system as recited in claim 26, wherein the objects include parameterized subcircuits.

* * * * *